United States Patent
Deguet et al.

(10) Patent No.: US 7,776,716 B2
(45) Date of Patent: Aug. 17, 2010

(54) METHOD FOR FABRICATING A SEMICONDUCTOR ON INSULATOR WAFER

(75) Inventors: Chrystel Deguet, Saint Ismier (FR); Takeshi Akatsu, St Nazaire les Eymes (FR); Hubert Moriceau, St Egreve (FR); Thomas Signamarcheix, La Terrasse (FR); Loic Sanchez, Charnecles (FR)

(73) Assignees: S.O.I.Tec Silicon on Insulator Technologies, Bernin (FR); Commissariat à l'Energie Atomique (CEA), Paris (FR)

( * ) Notice: Subject to any disclaimer, the term of this patent is extended or adjusted under 35 U.S.C. 154(b) by 735 days.

(21) Appl. No.: 11/746,297

(22) Filed: May 9, 2007

(65) Prior Publication Data

US 2007/0284660 A1 Dec. 13, 2007

(30) Foreign Application Priority Data

May 18, 2006 (EP) ................... 06290815

(51) Int. Cl.
  *H01L 21/46* (2006.01)
  *H01L 21/30* (2006.01)
(52) U.S. Cl. ............... 438/455; 257/E21.122; 257/E21.568
(58) Field of Classification Search ............ 438/455, 438/456, 457, 458, 459, 460; 257/625, 676, 257/779, 782, E21.122, E21.568, E21.57
See application file for complete search history.

(56) References Cited

U.S. PATENT DOCUMENTS

| | | | |
|---|---|---|---|
| 2002/0042169 A1 | 4/2002 | Lutzen et al. | 438/151 |
| 2003/0218212 A1* | 11/2003 | Lee et al. | 257/347 |
| 2005/0009348 A1 | 1/2005 | Ghyselen | 438/689 |
| 2007/0148958 A1* | 6/2007 | Clevenger et al. | 438/622 |

FOREIGN PATENT DOCUMENTS

WO   WO 2005/001915 A2   1/2005

OTHER PUBLICATIONS

Zhenghua AN et al., XP004378914, "Fabrication of Silicon-On-A1N Novel Structure and Its Residual Strain Characterization", Journal of Crystal Growth, Elsevier, vol. 244, No. 1, pp. 27-32, (2002).
Atsushi Ogura et al., XP002395889, "Minimization of Residual Stress in SOI Films by Using Aln Interlaid Insulator", Japanese Journal of Applied Physics, vol. 24, No. 8, pp. L669-L67, (1985).

* cited by examiner

*Primary Examiner*—Walter L Lindsay, Jr.
(74) *Attorney, Agent, or Firm*—Winston & Strawn LLP

(57) ABSTRACT

A method for fabricating semiconductor on insulator wafers by providing a semiconductor substrate or a substrate that includes an epitaxial semiconductor layer as a source substrate, attaching the source substrate to a handle substrate to form a source handle assembly and detaching the source substrate at a predetermined splitting area provided inside the source substrate and being essentially parallel to its main surface, to remove a layer from the source handle assembly to thereby create the semiconductor on insulator wafer. A diffusion barrier layer, in particular, an oxygen diffusion barrier layer can be provided on the source substrate. In addition the invention relates to the corresponding semiconductor on insulator wafers that are produced by the method.

28 Claims, 3 Drawing Sheets

METHOD FOR FABRICATING A SEMICONDUCTOR ON INSULATOR WAFER

BACKGROUND

The invention relates to a method for fabricating a semiconductor on insulator wafer which comprises the steps of providing a semiconductor substrate or a substrate that includes an epitaxial semiconductor layer as a source substrate, attaching the source substrate to a handle substrate to form a source handle assembly and detaching a main part of the source substrate at a predetermined splitting area, provided inside the source substrate and being essentially parallel to the main surface, from the source handle assembly to thereby create the semiconductor on insulator wafer. The invention also relates to the corresponding semiconductor on insulator wafers made by this method.

In these types of structures, e.g., for germanium on insulator wafers, the interface state density between the semiconductor and the underlying insulator layer often is not good enough to achieve acceptable electric characteristics. In some cases, for example germanium on silicon dioxide, the semiconductor layer and/or the interface with the oxide deteriorates due to oxidation. To overcome this problem, it has been proposed to modify the insulating layer by using $Si_3N_4$, $Ge_3N_4$ or $Ge_xO_yN_z$ layers. However, up to now, no acceptable interfaces have been achieved. Thus, there is a need for such structures with improved interfaces and these are now provided by the present invention.

SUMMARY OF THE INVENTION

The present invention relates to a method for fabricating a semiconductor on insulator wafer and to the corresponding semiconductor on insulator (SEOI) wafers produced thereby. These SEOI wafers have an improved semiconductor/insulator interface so that the electrical characteristics of the wafer can be improved, while also reducing wafer defectivity.

The method generally comprises providing a semiconductor substrate or a substrate comprising an epitaxial semiconductor layer as a source substrate, providing a diffusion barrier layer, in particular an oxygen diffusion barrier layer, on one main surface of the source substrate, attaching the source substrate to a handle substrate to form a source handle assembly, and detaching at least a part of the source substrate at a predetermined splitting area provided inside the source substrate and being essentially parallel to the main surface, from the source handle assembly compound to thereby create the semiconductor on insulator wafer.

The invention also relates to the SEOI substrates that are formed by the method. The substrates generally comprise a handle substrate comprising germanium (Ge), silicon (Si), thermally grown silicon dioxide on silicon (Si), silicon carbide (SiC), gallium arsenide (GaAs), gallium nitride, sapphire or quartz, a dielectric layer comprising an oxide layer, a $SiO_2$ layer, a high k dielectric layer, a silicon nitride layer, a carbon layer, an alumina layer or a diamond layer, a semiconductor layer comprising one of germanium (Ge), silicon (Si), gallium nitride (GaN), indium phosphide (InP) or gallium arsenide (GaAs), and a diffusion barrier layer between the semiconductor layer and the dielectric layer.

BRIEF DESCRIPTION OF THE DRAWING FIGURES

The advantageous embodiments of the invention will be described in the following by referring to the appended figures, wherein.

DETAILED DESCRIPTION OF THE PREFERRED EMBODIMENTS

Figure 1:
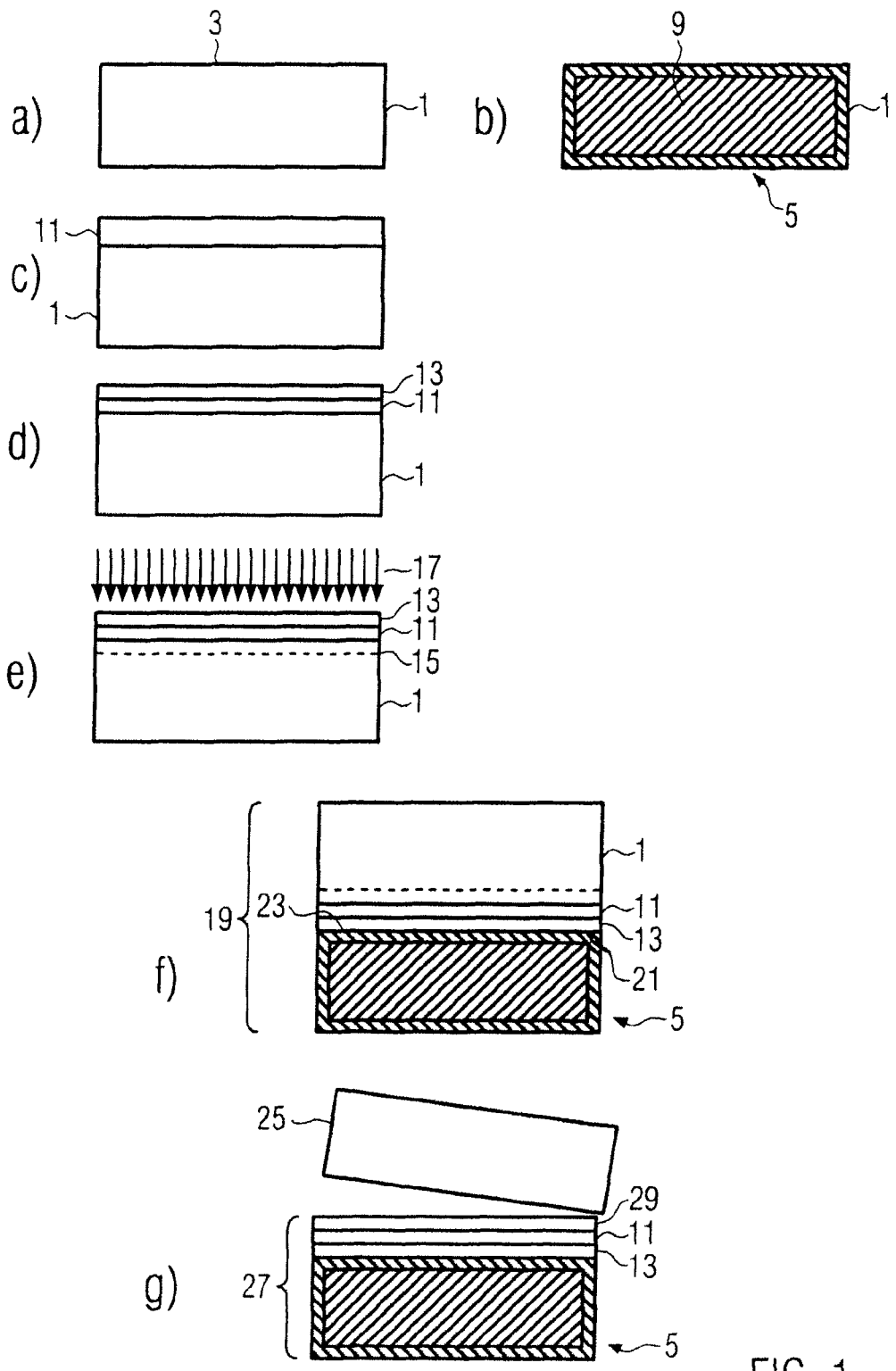
FIGS. 1a to 1g illustrate a first embodiment of the method for fabricating a semiconductor on insulator wafer according to the invention.

By providing a diffusion barrier layer, in particular an oxygen diffusion barrier layer, on one main surface of the source substrate, the deterioration of the semiconductor/insulator interface can be advantageously prevented, and in particular the deterioration of the electrical quality of the interface. Thereby the electrical characteristics of the SEOI wafer is improved.

Advantageously, the diffusion barrier layer can be a metal nitride layer, in particular, an aluminum nitride $AlN_x$ layer. Generally this layer can be deposited on all kinds of different layers.

Preferably, the inventive method can further comprise providing, on the diffusion barrier later, a dielectric layer or the deposition of a layer which could be transformed into a dielectric layer, in particular an oxide layer, a silicon dioxide layer, a high kk dielectric layer, such as a $HfO_2$ or $ZrO_2$ layer, a silicon nitride layer, a carbon layer, an alumina layer or a diamond layer. The advantageous method can be combined with all types of different insulating layers and is not limited to one particular insulating material. Thus, the invention provides a high flexibility concerning the choice of the materials to be used in the fabrication of an SEOI wafer.

According to an advantageous embodiment, a modified diffusion barrier layer could be obtained by modifying the chemical composition of the structure, preferably by reaction with at least oxygen and/or nitrogen of at least a part of the diffusion barrier layer. It is even possible to modify the entire diffusion barrier layer. Due to the formation of the modified layer, the negative impact of diffusion can be further reduced so that the interface properties in turn can be improved. Also, this leads to an improvement in the electric and morphological characteristics of the SEOI wafer.

Preferably, the modified diffusion barrier layer can be obtained by a thermal treatment. The necessary thermal treatment step can be either a dedicated thermal treatment step to modify the diffusion barrier layer or the modified layer can be a result of a thermal treatment step which is part of the subsequent fabrication process, e.g. a thermal treatment step to achieve the detachment of the SEOI wafer from the remainder of the source substrate. The thermal treatments have the advantage that they are easy to control so that they can be adapted to the material used.

According to a preferred embodiment, the modified diffusion barrier layer can be obtained by a thermal treatment after providing the dielectric layer or the layer to be transformed into the dielectric layer. By doing so, an interaction at the interface between the layer to be transformed into the dielectric layer or the dielectric layer and the diffusion barrier layer occurs which leads to the modified layer which further improves the diffusion delimiting properties and/or the SEOI properties.

Preferably the thermal treatment is at least one of a rapid thermal treatment, a thermal treatment under vacuum, a thermal treatment under controlled atmosphere, in particular, an oxidizing atmosphere, a treatment under an oxygen and/or nitrogen plasma, and an ozone treatment, under UV or not. Preferably the thermal treatment is realized in an atmosphere containing at least oxygen and/or nitrogen. Thus, depending on the materials used, the best suited thermal treatment can be applied to further improve the interface properties.

According to a preferred embodiment, the modified diffusion barrier layer is an aluminum oxynitride ($AlO_xN_y$) layer or a silicon aluminum oxynitride layer ($Si_xAl_yN_zO_t$) or a $Ge_xAl_yO_zN_t$ layer after reaction with diffusing Ge or with $GeO_2$ layer. It is the formation of this mixed layer which allows the improvement of the interface properties. Furthermore, it has been found out that for this specific of material, a modified layer could be obtained over the entire thickness of the diffusion barrier layer.

According to another variant, the diffusion barrier layer can be provided by a surface treatment such as plasma, UV or ozone treatment. According to a further variant, a second diffusion barrier layer can be provided on the modified diffusion barrier layer. These layers further reduce the negative impact of the insulating layer on the semiconductor layer.

According to an advantageous embodiment, prior to attaching the source substrate to the handle substrate a third diffusion barrier layer can be provided on the surface of the handle substrate, i.e., that surface that is going to be attached to the source substrate. In this case, the diffusion barrier layer itself can also play the role of the insulating layer.

Preferably, the first, and/or second and/or third diffusion barrier layer is/are provided with at least one mono layer to 2 μm, in particular 2 nm up to 20 nm, and more particularly, with a thickness of 3 nm and/or when the dielectric layer can be provided with a thickness of 200 nm to 500 nm, in particular with a thickness of 300 nm. Surprisingly, for already very thin diffusion barrier layers, the desired improvement of the electric characteristics can be achieved, and this even for dielectric layers which are several orders of magnitude thicker than the diffusion barrier layer.

Preferably, the first and second and/or third delimiting layer can be of the same material. By choosing the same material, the fabrication process is simplified and in all the different cases, the creation of defects at the interfaces can be limited.

According to an advantageous embodiment, the method can further comprise creating the predetermined splitting area inside the source substrate, preferably by implanting or co-implanting atomic species prior to providing the diffusion barrier. Using this method a well defined predetermined splitting area can be achieved which subsequently allows the re-use or recycling of the remainder of the source substrate. In addition, depending on the material, the implantation step is either carried out before or after providing the diffusion barrier layer.

Preferably, the method can further comprise cleaning the main surface, in particular, by using fluoric acid, buffered acid, cyclic fluoric acid, water and/or ozone and/or brushing. With the surface of the source substrate prepared in this way, the results concerning the electrical properties of the final semiconductor on insulator wafer can be further improved.

As for materials, the semiconductor of the source substrate can be one of germanium, silicon, gallium nitride, indium phosphide, or gallium arsenide and/or the material of the handle substrate can be one of germanium, silicon, thermally grown silicon dioxide on silicon, silicon carbide, gallium arsenide, gallium nitride, quartz or sapphire.

The invention is particularly advantageous for semiconductor on insulator wafers of germanium on insulator, as the germanium oxide is instable and that, furthermore, germanium/silicon dioxide interfaces present bad interface state densities leading to poor electrical characteristics. By providing the diffusion barrier layer according to the invention, these problems can be overcome.

The advantages achieved with the semiconductor on insulator wafer according to the invention and its advantageous embodiments have already been discussed in detail herein in the description of the inventive method. Their description is thus not repeated again but is incorporated herewith by reference. The invention is applicable not only for the transfer of the entire surface of a source substrate but also for a partial transfer in case of patterned surfaces.

In the following a method for fabricating a semiconductor on insulator wafer according to the invention will be described using the so-called SMART-CUT® technology. However, other semiconductor on insulator manufacturing methods are also suitable and could be adapted to the invention. Furthermore, the invention will be described for a germanium wafer as semiconductor on insulator wafer. However, the invention is also applicable to other types of semiconductors, in particular, pure germanium or germanium compounds doped or not, with Si from 0% to 100% gallium nitride, indium phosphide or gallium arsenide.

FIG. 1a) illustrates a germanium (Ge) substrate 1, or, as a variant, a substrate with an epitaxial germanium layer provided on one of its main surfaces. The surface 3 of the source substrate 1 may be cleaned for instance using cyclic fluoric acid (CHF), fluoric acid (HF), water and/or ozone with or without a brushing step, prior to further processing.

FIG. 1b) illustrates a handle substrate 5 which can be, for example, a germanium wafer, a silicon wafer, a silicon wafer with a thermally formed silicon dioxide layer, a silicon carbide wafer, a wafer presenting a silicon germanium front surface or a gallium arsenide wafer. Eventually, also a quartz wafer or sapphire could be used. Both the source substrate 1 as well as the handle substrate 5 may have any suitable size or form such as, for example, 200 mm or 300 mm wafers.

In this embodiment, the handle substrate 5 is illustrated with a thermally formed insulating layer 7 around the base material 9 of the handle substrate 5. The dielectric layer 7, can, in particular, be an oxide layer, like for example, a silicon dioxide layer, in case a silicon handle substrate is used, a high k dielectric layer, a silicon nitride layer, a carbon layer, an alumina layer or a diamond layer.

FIG. 1c) illustrates the inventive method for fabricating a semiconductor on insulator wafer which consists in providing a diffusion barrier layer, in particular, an oxygen diffusion barrier layer, on surface 3 of the source substrate 1. In this embodiment, the diffusion barrier layer is an aluminum nitride $AlN_x$ layer 1, but other metal nitride layers are also suitable and can be used according to the invention.

The $AlN_x$ layer is deposited with a thickness of 3 nm. However, thicknesses of 1 mono layer up to 2 μm, in particular 2 nm to up to 20 nm are also suitable. The layer can be deposited using standard deposition techniques, like physical vapor deposition (PVD) or atomic layer deposition (ALD) in particular, molecular beam epitaxy (MBE).

The $AlN_x$ layer 11 is then subjected to one or several additional treatments, for example, a treatment under an oxygen plasma and/or nitrogen plasma, a UV ozone treatment or a thermal treatment under oxygen to form a modified layer 13 of the $Al_xO_yN_z$ (see FIG. 1d). In all the different treatments, the sources have to contain at least oxygen and nitrogen. According to a variant, the thermal treatment can be a rapid thermal treatment.

According to another variant, only part of the $AlN_x$ layer 11 is modified by such treatment to form a modified layer 13.

In the subsequent step, illustrated in FIG. 1e, a predetermined splitting area 15, being essentially parallel to the main surface 3, which is provided with the $AlN_x$ layer 11 is created inside the source substrate 1. In the SMART-CUT® technology, this is achieved by implanting atomic species 17, for example, hydrogen ions, with a predetermined energy and dose into the source substrate 1. Co-implantation using different species like helium for example represents an alternative. The implantation usually occurs through the previously provided $AlN_x$ layer 11 and the modified layer 13.

According to further variants, the implantation step could be carried out prior to providing the $AlN_x$ layer 11, or prior to carrying out the heat treatment to obtain the modified layer 13.

In the following step, illustrated in FIG. 1f, the handle substrate 5 and the source substrate 1 with the $AlN_x$ layer 11 and the modified layer 13 on top are bonded together to create the source handle assembly 19. Bonding occurs between the main surfaces 21 of the oxide layer 7 on the handle substrate 5 and the surface 23 of the modified layer 13. As the surface qualities of both layers fulfill the bonding criteria with respect to surface roughness, nano-topology, side flatness, particle density and wafer deformation (bow and warp), bonding between the two substrates can be achieved even without previously polishing the surface 23 of the modified layer 13. It is important to mention, that the temperature of the thermal treatment step shall be chosen such that the bonding step, illustrated in FIG. 1f), can be carried out.

FIG. 1g illustrates the result of the detachment step, which in the SMART-CUT® process is generally a thermal annealing of the source handle assembly 19. During annealing, the predetermined splitting area 15 is weakened until complete detachment between the remainder of the source substrate 25 and the germanium on insulator wafer 27, being composed of the handle substrate 5, the modified layer 13, the $AlN_x$ layer 11 and a transferred germanium layer 29 which have been transferred from the original source substrate 1 onto the handle substrate 5, occurs. The remainder of the original source substrate 25 is removed and can be re-utilized as source substrate 1 in a subsequent germanium on insulator manufacturing process, after reclaiming it like during the SOI SMART-CUT® process.

According a variant, the detachment step can be achieved applying mechanical constraints or the combination of thermal and mechanical constraints.

According to a variant the transferred germanium layer 29 is not transferred over the entire area of the surface of the handle substrate, but only partially.

After the detachment, the surface of the transferred layer is subjected to a polishing step e.g. a CMP step. Also, it is possible to add a final thermal treatment step between 500° C. and 750°, preferably at 550° C. to reconstruct the layer which has been degraded by the ion implantation, for 30 min to 3 hrs, preferably 1 h. According to a further variant, a thermal treatment under oxygen can be carried out, to reduce the thickness of the germanium layer 29.

With the above described inventive process, it is therefore possible to provide a germanium on insulator wafer 27 which has a superior quality with respect to its electrical characteristics due to the fact that by providing the $AlN_x$ layer 11 and the modified layer 13, the interface properties between the semiconductor layer, e.g. the germanium layer 29 and the dielectric layers 7, 11, 13 are improved. This interface stabilization is attributed to the nitrogen atoms in the $AlN_x$ layer and the modified layer which form an oxygen diffusion barrier, thereby preventing the oxidation of the germanium layer 29.

Figure 2A:
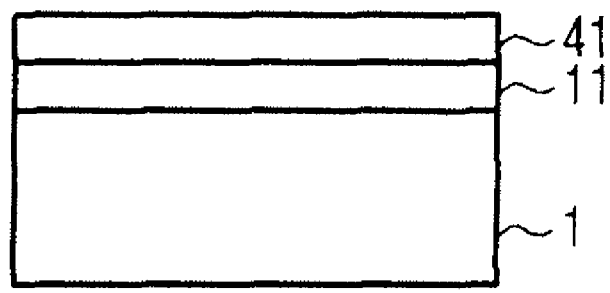
FIGS. 2a and 2b illustrate a part of a second embodiment of the method for fabricating a semiconductor on insulator wafer according to the invention.

FIG. 2 illustrates a second embodiment of the inventive method for fabricating a semiconductor on insulator wafer. The steps illustrated by FIGS. 2a) and 2b) replace the step illustrated in FIG. 1d) of the first embodiment. The other steps described with respect to the first embodiment are the same or at least similar in the second embodiment. Their description will thus not be repeated again, but is incorporated herewith by reference.

Following the deposition of the $AlN_x$ layer (see FIG. 1c)) 11, the method according to the second embodiment continues with a deposition step during which a silicon dioxide layer 41 with a thickness of 200 to 500 nm, preferably 300 nm, is deposited onto the $AlN_x$ layer 11. This can, for example, be realized using plasma enhanced chemical vapor deposition (PECVD).

Instead of a silicon dioxide layer, also other suitable dielectric layers, e.g. other types of oxides, a high k dielectric layer, like a $HfO_2$ or $ZrO_2$ layer, a silicon nitride layer, a carbon layer, an alumina layer or a diamond layer could also be deposited on the $AlN_x$ layer 11.

Figure 2B:
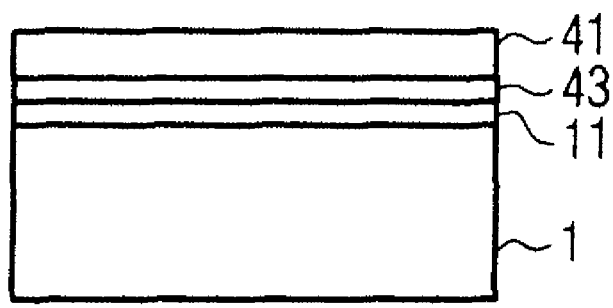

In the subsequent step illustrated in FIG. 2b), a thermal treatment is carried out to create a modified layer of $Si_xAl_yO_zN_t$ at the interface between the silicon dioxide layer 41 and the $AlN_x$ layer 11. This thermal treatment is typically carried out at 300° C. to 600° C. for about 1 to 150 minutes. According to a variant, a further densification step at about 600° C. for about 30 to 60 minutes depending on the deposition technique used is carried out.

The method then continues with the step illustrated in FIG. 1e, namely, the implantation of ions to create the predetermined splitting area 15. Like in the first embodiment the implantation step could also be carried out prior to the deposition of the $AlN_x$ layer 11, prior to the deposition of the $SiO_2$ layer 41 or just prior to the creation of the modified layer 43.

According to a further variant, it is also possible to not apply a dedicated thermal treatment step, and to let the modified layer 43 form during a subsequent thermal treatment step in relation to the SMART-CUT® process, for example, when the temperature is raised to achieve the detachment (FIG. 1f).

Figure 3:
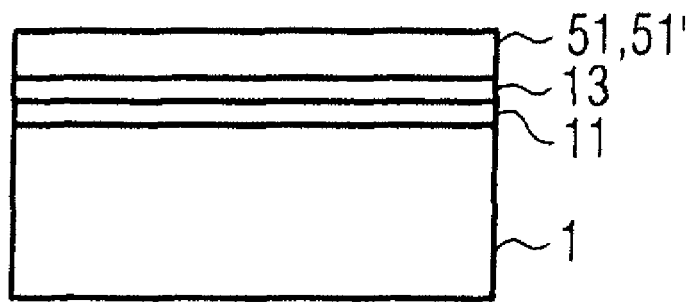
FIG. 3 illustrates a part of a third embodiment of the method for fabricating a semiconductor on insulator wafer according to the invention.

FIG. 3 illustrates a part of a third inventive embodiment of the method for fabricating a semiconductor on insulator wafer. In this embodiment, the first steps correspond to the ones of the first embodiment, namely, the steps corresponding to FIGS. 1a) to 1d). The description of these steps is not repeated again in detail but is incorporated herewith by reference.

Following the creation of the modified layer 13, a dielectric layer, in this embodiment, a silicon dioxide layer 51 is deposited in the same way as described in the second embodiment (FIG. 2A).

The process then continues with the steps illustrated in FIGS. 1e) to 1g). The description will, again, not be repeated but is incorporated herein by reference.

Like in the first and second embodiment, the ion implantation, illustrated in FIG. 1e), can also be carried out prior to the deposition of the silicon dioxide layer 51. Instead of a silicon dioxide layer like in the second embodiment, also other types of dielectric layers, in particular, another oxide layer, a high k dielectric layer, a silicon nitride layer, a carbon layer, or a diamond layer could also be provided on the modified layer 13.

According to another variant, after the creation of the modified layer 13, the deposition of the $AlN_x$ layer could be continued using the same deposition technique as for the first $AlN_x$ layer 11, thereby creating a second $AlN_x$ layer 51'. Another possibility consists in, right from the beginning, depositing a thick $AlN_x$ layer, thus in one growth step, and to create the modified layer during a thermal treatment in the subsequent process steps e.g. during the detachment step.

Figure 4A:
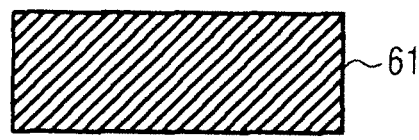
FIGS. 4a and 4b illustrate two semiconductor on insulator wafers according to the invention which can be achieved by the second or third embodiment of the inventive method.
Figure 4B:
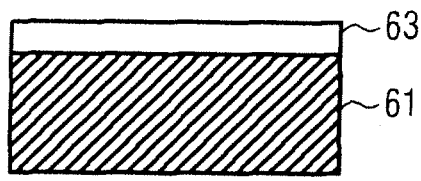

FIGS. 4a) and 4b) illustrate a part of the steps of a fourth embodiment of the inventive method for fabricating a semiconductor on insulator wafer. Compared to the first to third embodiment, the difference in the fourth embodiment is that instead of using a handle substrate 5 as shown in FIG. 1b) or using a handle substrate 5 without dielectric layer 7, a handle substrate 61 is used on which a third $AlN_x$ layer 63 is deposited using one of the deposition methods as described for the first $AlN_x$ layer 11 deposition illustrated in FIG. 1c). The description of this deposition is not repeated again, but incorporated herewith by reference.

According to the fourth embodiment, the bonding step illustrated in FIG. 1f) is slightly different. In fact, now bonding has to occur between the third $AlN_x$ layer 63 and either the modified layer 13, the silicon dioxide layer 41, or 51 or the second $AlN_x$ layer 51'. In case of a bonding between two $AlN_x$ layers (the thin first layer 11 or the rather thick second layer 51') there is no need for a dedicated thermal treatment step as, due to the presence of water molecules on the surface, oxygen is present at the interface between the two layers. The transformation of the $AlN_x$ layers into a modified layer 13 then can occur during a thermal treatment which is carried out in one of the subsequent steps, in particular, the detachment step illustrated in FIG. 1g).

Of course, embodiment 4 can be combined with any of the embodiments 1 to 3.

Figure 5A:
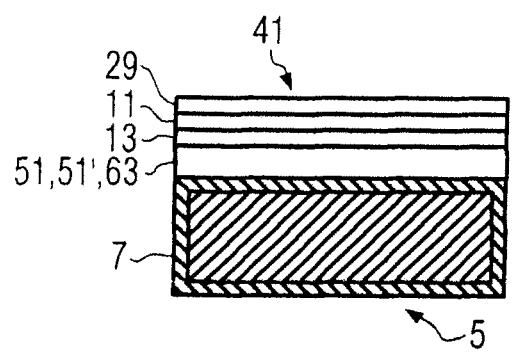
FIGS. 5a to 5c illustrate a part of the method for fabricating semiconductor on insulator wafers according to a fourth embodiment of the invention.

FIGS. 5a) to 5c) illustrate the germanium on insulator wafers 71, 81 and 91 which can be achieved by the methods according to the second, third or fourth, embodiment. The germanium on insulator wafer 71 illustrated in FIG. 5a) comprises the handle substrate 5 with the dielectric layer 7, the dielectric layer, e.g. the $SiO_2$ layer 51 or the second/third $AlN_x$ layer 51', 63, the modified layer 13, the first $AlN_x$ layer 11 and finally the germanium layer 29 transferred from the original source substrate 1.

Figure 5B:
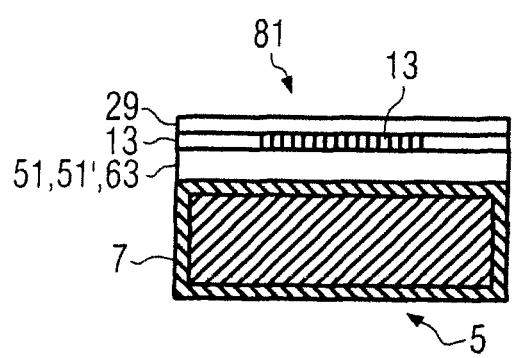

According to variants, the first $Al_xN$ layer 11 could be transformed totally into the modified layer 13. In this case, the final substrate does not comprises the layer 11 anymore. In another variant, just parts of the surface of the first layer 11 are transformed into the modified layer 13 leading to a structure 81 as shown in FIG. 5b). In this case the area of the modified layer 13 represents only a part of the surface area of the handle substrate 5.

Figure 5C:
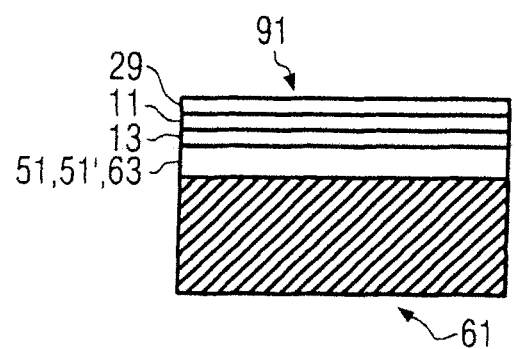

FIG. 5c) illustrates an alternative inventive germanium on insulator wafer 91, wherein no dielectric layer 7 is provided on the handle substrate 5. Thus in this case the handle substrate illustrated in FIG. 1b) has been prepared such that no dielectric layer, like the natural oxide, is present thereon. Except for this difference, the structure of germanium on insulator wafer 91 corresponds to the one of the embodiment shown in FIG. 5a). The wafer 91 could of course also have a modified layer 13, like illustrated in FIG. 5b).

Of course, as mentioned above, instead of a germanium on insulator wafer, also other types of wafers comprising the $AlN_x$ layer 11 and the modified layer 13 are according to the invention. In particular, the handle substrate 5 can be one of germanium, silicon, thermally grown silicon dioxide, silicon carbide, gallium arsenide, gallium nitride, sapphire or quartz. Instead of a silicon dioxide dielectric layer 51, a high k dielectric layer, silicon nitride layer, or diamond layer can also be used. As a semiconductor layer, instead of germanium 29, also pure germanium or germanium compounds doped or not, with Si from 0% to 100%, a gallium nitride, an indium phosphide or a gallium arsenide semiconductor layer could be used.

All embodiments have in common that the improved electrical and morphological characteristics are achieved due to the presence of the $AlN_x$ layer 11 and advantageously the modified layer 13 wherein the nitrogen atoms play the role of inhibitors for the oxygen diffusion so that the interface properties and, as a consequence, the electric characteristics, can be improved.

The same is also achieved in case that $AlN_x$ is used as the buried oxide (BOX) in the germanium on insulator wafer or the other types of semiconductor on insulator wafers according to the invention. According to a further variant, it is also possible that the modified layer reacts with the adjacent layers and forms further types of anti-diffusion barriers.

What is claimed is:

1. A method for fabricating a semiconductor on insulator wafer which comprises:
   providing a semiconductor substrate or a substrate comprising an epitaxial semiconductor layer as a source substrate,
   providing a diffusion barrier layer on one main surface of the source substrate, wherein the diffusion barrier layer is a metal nitride layer present in a thickness to act as an oxygen diffusion barrier,
   attaching the source substrate to a handle substrate to form a source handle assembly, and
   detaching at least a part of the source substrate at a predetermined splitting area provided inside the source substrate and being essentially parallel to the main surface, from the source handle assembly compound to thereby create the semiconductor on insulator wafer.

2. The method of claim 1, wherein the diffusion barrier layer is an aluminum nitride $AlN_x$ layer.

3. The method of claim 1, which further comprises depositing an initial layer that will be transformed into a dielectric layer.

4. The method of claim 3, wherein the initial layer is an oxide layer, a $SiO_2$ layer, a high k dielectric layer, a silicon nitride layer, a carbon layer, an alumina layer or a diamond layer.

5. The method of claim 1, which further comprises providing a modified diffusion barrier layer by modifying the chemical composition of at least a part of the diffusion barrier layer.

6. The method of claim 5, wherein the modified diffusion barrier layer is obtained by a thermal treatment.

7. The method of claim 6, wherein the modified diffusion barrier layer is obtained by a thermal treatment after providing a dielectric layer or a layer to be transformed into the dielectric layer.

8. The method of claim 6, wherein the thermal treatment is at least one of a rapid thermal treatment, a standard thermal treatment, a thermal treatment under vacuum, a thermal treatment under a controlled atmosphere.

9. The method of claim 6, wherein the thermal treatment is conducted in an oxidizing atmosphere, a treatment under an oxygen or nitrogen plasma, or an ozone treatment with or without UV.

10. The method of claim 5, wherein the treatment is a surface treatment.

11. A method for fabricating a semiconductor on insulator wafer which comprises:
providing a semiconductor substrate or a substrate comprising an epitaxial semiconductor layer as a source substrate,
providing a diffusion barrier layer on one main surface of the source substrate,
providing a modified diffusion barrier layer by modifying the chemical composition of at least a part of the diffusion barrier layer,
attaching the source substrate to a handle substrate to form a source handle assembly, and
detaching at least a part of the source substrate at a predetermined splitting area provided inside the source substrate and being essentially parallel to the main surface, from the source handle assembly compound to thereby create the semiconductor on insulator wafer,
wherein the modified diffusion barrier layer is an aluminum oxynitride $AlO_xN_y$, a silicon aluminum oxynitride $Si_xAl_yN_zO_t$ or a germanium aluminum oxynitride $Ge_xAl_yO_zN_t$ layer.

12. A method for fabricating a semiconductor on insulator wafer which comprises:
providing a semiconductor substrate or a substrate comprising an epitaxial semiconductor layer as a source substrate,
providing a diffusion barrier layer on one main surface of the source substrate,
providing a second diffusion barrier layer on the diffusion barrier layer,
attaching the source substrate to a handle substrate to form a source handle assembly, and
detaching at least a part of the source substrate at a predetermined splitting area provided inside the source substrate and being essentially parallel to the main surface, from the source handle assembly compound to thereby create the semiconductor on insulator wafer.

13. The method of claim 1, wherein prior to attaching the source substrate to the handle substrate, a further diffusion barrier layer is provided on the surface of the handle substrate that is to be attached to the source substrate.

14. The method of claim 1, wherein the diffusion barrier layer is provided with a thickness of at least one monolayer up to 2 µm or wherein the dielectric layer is provided with a thickness of 200 nm to 500 nm.

15. The method of claim 13, wherein the barrier layers are of the same material.

16. The method of claim 1, which further comprises creating the predetermined splitting area inside the source substrate by implanting or co-implanting atomic species into the source substrate.

17. A method for fabricating a semiconductor on insulator wafer which comprises:
providing a semiconductor substrate or a substrate comprising an epitaxial semiconductor layer as a source substrate,
providing a diffusion barrier layer on one main surface of the source substrate,
attaching the source substrate to a handle substrate to form a source handle assembly,
detaching at least a part of the source substrate at a predetermined splitting area provided inside the source substrate and being essentially parallel to the main surface, from the source handle assembly compound to thereby create the semiconductor on insulator wafer, and
cleaning the main surface with fluoric acid (HF), buffered acid, cyclic fluoric acid (CHF), water or ozone with or without brushing.

18. The method of claim 1, wherein the semiconductor of the source substrate is one of germanium (Ge), silicon (Si), gallium nitride (GaN), indium phosphide (InP) or gallium arsenide (GaAs) or wherein the material of the handle substrate is one of germanium (Ge), silicon (Si), thermally grown silicon dioxide on silicon (Si), silicon carbide (SiC), gallium arsenide (GaAs), gallium nitride, sapphire or quartz.

19. A semiconductor on insulator (SeOI) wafer comprising
a handle substrate comprising germanium (Ge), silicon (Si), thermally grown silicon dioxide on silicon (Si), silicon carbide (SiC), gallium arsenide (GaAs), gallium nitride, sapphire or quartz,
a dielectric layer comprising an oxide layer, a $SiO_2$ layer, a high k dielectric layer, a silicon nitride layer, a carbon layer, an alumina layer or a diamond layer,
a semiconductor layer comprising one of germanium (Ge), silicon (Si), gallium nitride (GaN), indium phosphide (InP) or gallium arsenide (GaAs), and
a diffusion barrier comprising a metal nitride layer between the semiconductor layer and the dielectric layer.

20. The SeOI wafer of to claim 19, further comprising a modified diffusion barrier layer resulting from oxidation of at least a part of the diffusion barrier layer.

21. The SeOI wafer of claim 20, wherein the area of the modified diffusion barrier layer represents only a part of the area of the handle substrate.

22. A semiconductor on insulator (SeOI) wafer comprising
a handle substrate comprising germanium (Ge), silicon (Si), thermally grown silicon dioxide on silicon (Si), silicon carbide (SiC), gallium arsenide (GaAs), gallium nitride, sapphire or quartz,
a dielectric layer comprising an oxide layer, a SiO2 layer, a high k dielectric layer, a silicon nitride layer, a carbon layer, an alumina layer or a diamond layer, and
a semiconductor layer comprising one of germanium (Ge), silicon (Si), gallium nitride (GaN), indium phosphide (InP) or gallium arsenide (GaAs), and
a diffusion barrier layer between the semiconductor layer and the dielectric layer, wherein the diffusion barrier layer is an aluminum oxynitride AlON or a silicon aluminum oxynitride $Si_xAl_yN_zO_t$ or a germanium aluminum oxynitride $Ge_xAl_yO_zN_t$ layer.

23. The SeOI wafer of claim 19, further comprising a second diffusion barrier layer under the diffusion barrier layer.

24. The SeOI wafer of claim 19, further comprising a third diffusion barrier layer beneath the diffusion barrier layer.

25. The SeOI wafer of claim 19, wherein the dielectric layer and the diffusion barrier layer are of the same material.

26. The SeOI wafer of claim 19, wherein the diffusion barrier layer has a thickness of at least one monolayer up to 2 µm or wherein the dielectric layer is provided with a thickness of 200 nm to 500 nm.

27. The SeOI wafer of claim 19, wherein the area of the semiconductor layer is smaller than the area of the handle substrate due to a partial transfer.

28. The method of claim 3 wherein the initial layer is transformed into a high k dielectric layer comprising $HfO_2$ or $ZrO_2$.

* * * * *